United States Patent
Roovers et al.

(10) Patent No.: US 9,673,971 B2
(45) Date of Patent: Jun. 6, 2017

(54) AUTOMATIC CLOCK CALIBRATION OF A REMOTE UNIT USING PHASE DRIFT

(71) Applicant: Dialog Semiconductor B.V., 's-Hertogenbosch (NL)

(72) Inventors: Wik Roovers, Prinsenbeek (NL); Steven Leussink, Utrecht (NL)

(73) Assignee: Dialog Semiconductor B.V., 's-Hertogenbosch (NL)

( * ) Notice: Subject to any disclaimer, the term of this patent is extended or adjusted under 35 U.S.C. 154(b) by 243 days.

(21) Appl. No.: 13/710,664

(22) Filed: Dec. 11, 2012

(65) Prior Publication Data

US 2014/0161214 A1 Jun. 12, 2014

(30) Foreign Application Priority Data

Dec. 7, 2012 (EP) .................................. 12368032

(51) Int. Cl.
| | |
|---|---|
| *G06F 1/12* | (2006.01) |
| *H04L 7/04* | (2006.01) |
| *H03L 1/02* | (2006.01) |
| *H03L 7/12* | (2006.01) |
| *H04L 7/10* | (2006.01) |

(52) U.S. Cl.
CPC ............... *H04L 7/04* (2013.01); *H03L 1/025* (2013.01); *H03L 7/12* (2013.01); *H04L 7/10* (2013.01)

(58) Field of Classification Search
CPC ..... G06F 1/12; H04L 7/04; H04L 7/12; H04L 7/10; H03L 1/025
See application file for complete search history.

(56) References Cited

U.S. PATENT DOCUMENTS

| | | | |
|---|---|---|---|
| 5,416,807 A | 5/1995 | Brady et al. | |
| 5,819,076 A | 10/1998 | Jeddeloh et al. | |
| 5,875,388 A | 2/1999 | Daughtry, Jr. et al. | |
| 6,326,830 B1 | 12/2001 | Brady et al. | |
| 6,545,950 B1* | 4/2003 | Walukas et al. | 368/47 |
| 7,155,176 B2* | 12/2006 | Komaili et al. | 455/76 |

(Continued)

FOREIGN PATENT DOCUMENTS

| | | |
|---|---|---|
| EP | 0 483 090 | 4/1992 |
| EP | 0 551 106 | 7/1993 |

(Continued)

OTHER PUBLICATIONS

European Search Report 12368032.4-1851 Mailed: Jul. 8, 2013.

(Continued)

*Primary Examiner* — Zahid Choudhury
(74) *Attorney, Agent, or Firm* — Saile Ackerman LLC; Stephen B. Ackerman

(57) ABSTRACT

An automatic calibration of a clock of a wireless portable part with respect to a clock of a fixed part in a field environment. The calibration performed in the field environment negates the need to calibrate the clock during manufacture and negates the need for an initial field recalibration because of temperature differences between manufacture and the field. In performing the calibration the frequency of the clock of the portable part is varied until the portable part is synchronous with the fixed part to with in a range of timing bits. The portable part is declared calibrated after remaining calibrated for a defined number of data frames.

14 Claims, 4 Drawing Sheets

(56) References Cited

U.S. PATENT DOCUMENTS

| | | | |
|---|---|---|---|
| 2002/0181633 A1* | 12/2002 | Trans | 375/354 |
| 2004/0259544 A1* | 12/2004 | Amos | H04M 1/2535 455/435.1 |
| 2005/0137816 A1* | 6/2005 | Chuang et al. | 702/106 |
| 2008/0222440 A1* | 9/2008 | Jones et al. | 713/400 |
| 2010/0046683 A1 | 2/2010 | Beukema et al. | |
| 2011/0239031 A1 | 9/2011 | Ware et al. | |
| 2012/0223757 A1 | 9/2012 | Camp | |

FOREIGN PATENT DOCUMENTS

| | | |
|---|---|---|
| EP | 0 884 845 | 12/1998 |
| EP | 1 134 897 | 9/2001 |

OTHER PUBLICATIONS

"Architecture and Implementation of an Efficient and Robust TDMA Frame Structure for Digital Portable Communications," by N. R. Sollenberger et al., Gateway to New Concepts in Vehicular Technology, IEEE, vol. 1, May 1, 1989, pp. 169-174.

* cited by examiner

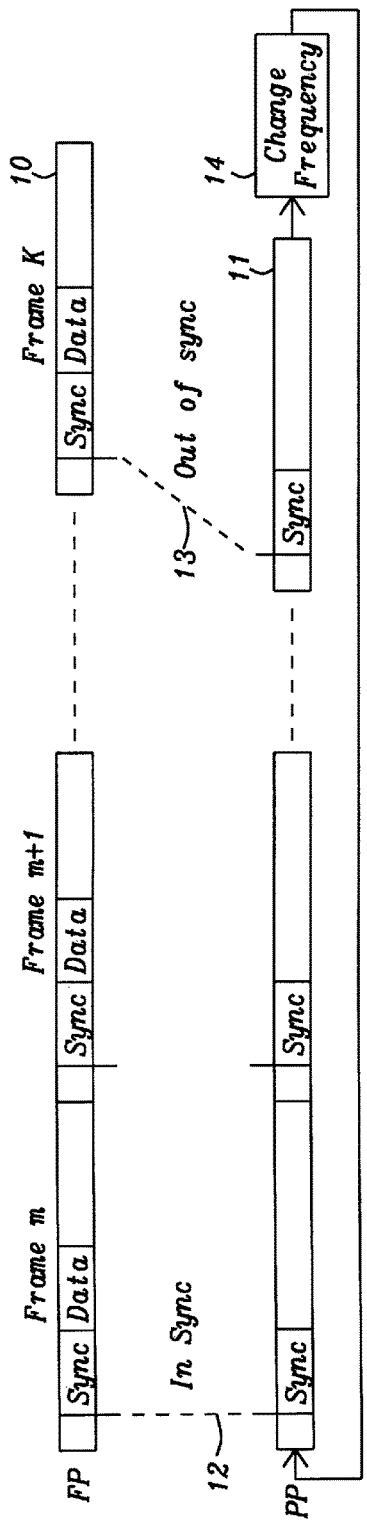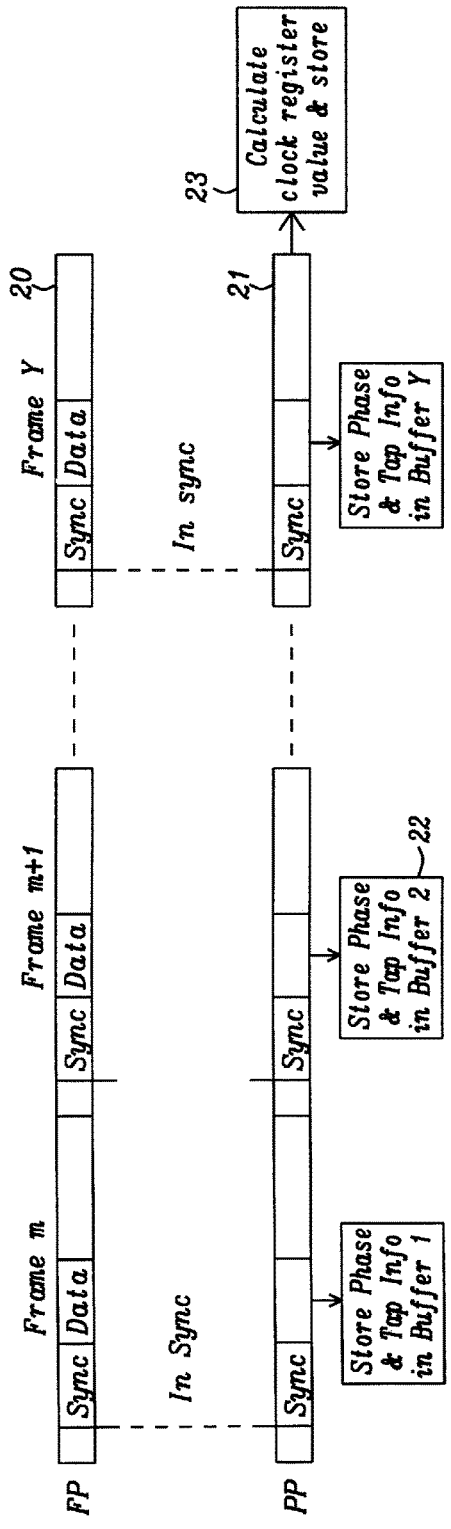

AUTOMATIC CLOCK CALIBRATION OF A REMOTE UNIT USING PHASE DRIFT

TECHNICAL FIELD

The present invention is related to calibration of signals in a portable unit relative to a fixed unit and more specifically to the signal calibration in a portable unit using phase drift.

BACKGROUND

There are electronic devices such as wireless phones, wherein a hand set is coupled to a base unit through a wireless medium. As these devices become more and more ubiquitous cost becomes more and more a factor. Curtailing cost relies heavily on reducing manufacturing cost, for instance hardware elements such as devices and pins, and manufacturing setup and test times. For example, elimination of a circuit pin reduces cost more because of the required testing than the physical existence of the circuit pin, assuming the adequacy of real estate to provide for having the pin. Performing calibration in manufacturing and then at some point recalibrating in the field tends to waste the calibration in manufacturing and the associated product cost. If a field calibration, or more importantly an automatic field calibration, could be devised to provide an automatic calibration of an electronic device in the field would not only eliminate the need for calibrating the electronic device in manufacturing, but also eliminate, or nearly eliminate, the disruption of operations for calibration in the field.

US Patent Application Publication No. 2012/0223757 A1 (Camp) is directed to methods and apparatuses with a dynamically adjustable characteristics and using a phase adjustment circuit. In US Patent Application Publication No. 2011/0239031 A1 (Ware et al.) a low power signaling system is directed to an open loop clock distribution circuit. US Patent Application Publication No. 2010/0046683 A1 (Beukema et al.) is directed to systems and methods for adaptive clock and equalization control for data receivers that is based on a closed loop sampling clock framework. US Patent Application Publication No. 2008/0222440 A1 (Jones et al.) is directed to a temperature based real time clock calibration system and method. U.S. Pat. No. 6,545,950 B1 (Walukas et al.) is directed to an electronic clock calibration system that generates an output signal responsive to a base reference signal, which is less accurate than the base reference signal. In U.S. Pat. No. 6,326,830 B1 (Brady et al.) an automatic clock calibration circuit, is directed to a phrase frequency detector that detects the phrase differences between clock signals.

SUMMARY

It is an objective of the present disclosure to automatically calibrate a portable part, for instance a wireless remote, without physical connections to a fixed part, for instance a base unit, while the portable part and the fixed part are active in a field operational environment.

It is further an objective of the present disclosure to calibrate a clock of the portable part when the clock drift is out side allowable limits.

It is still further an objective of present disclosure that a timing drift of the portable part with respect to the fixed part between approximately −15 and +8 timing bits is defined as being in lock, or in sync.

It is also an objective of the present disclosure to use the field calibration of the portable part to replace clock calibration in manufacturing and eliminate the necessity for an accurate crystal in the portable part.

The present disclosure exhibits a fundamental change in the manufacture of an electronic device, where calibration of clocks between a fixed part (FP) and a portable part (PP) is not done in manufacturing, but automatically after installation in the field. The electronic device comes in at least two parts, a fixed part that has a fixed location and at least one portable part that is moveable within a physical range about the fixed part. The portable part can, for example be an environmental parameter measuring device, e.g. measuring humidity or temperature. The fixed part comprises a base unit for receiving, storing or sending measured parameters that are received from the portable part.

In the manufacture of the fixed and portable parts a calibration of the clocks were performed. Beside the test and calibration time required, this also required additional hardware that necessitated testing, a pin and associated circuitry, all of which added manufacturing cost. Any calibration performed was at a specific temperature and once the parts reached the field in a customer's environment, the calibration could easily be required to be redone because of difference in temperature, for instance.

The present disclosure automatically calibrates the clocks in the portable part relative to the fixed part and performs the calibration in the field in the customer's environment. This eliminates manufacturing costs associated with an initial calibration and provides a calibration in a customer's environment and is performed automatically.

In order to do the calibration in the field and the customer's environment a dummy carrier is produced by the fixed part. The portable part is set into a receiving mode at the lowest possible clock frequency. After waiting a period of time, either synchronization between the fixed part using the dummy carrier is accomplished, or the effort to synchronize times out. If the synchronization times out, the clock frequency of the portable part is changed (increased if starting at the lowest possible clock frequency) and synchronization is again attempted. When synchronization is accomplished, the portable part is monitored to insure that synchronization is maintained for "Y" cycles, which are enough cycles to determine marginal synchronization. If synchronization cannot be maintained for "Y" cycles, the clock frequency of the portable part is changed and synchronization of the portable part to the fixed part is again checked to determine if the two parts have been synchronized. It is possible that the clock frequency of the portable part that was marginally set was on the high side of the frequency synchronizing in which the frequency of the portable part needs to be reduced to achieve synchronization. After a durable synchronization has been established a clock register value is calculated and stored in the portable part. Since the calibration (synchronization) is temperature dependent several values of the clock register value for different temperatures can be established and stored in the memory of the portable part.

BRIEF DESCRIPTION OF THE DRAWINGS

This invention will be described with reference to the accompanying drawings, wherein:

FIG. 1 is a diagram of the present disclosure of the signal relationship between a fixed part and a portable part that is in need of calibration;

FIG. 2 is a diagram of the present disclosure of the signal relationship between a fixed part and a parallel part that are synchronized and not in need of calibration.

DETAILED DESCRIPTION

In FIG. 1 two carrier signals of the present disclosure used for calibration of an associated combination of a portable part (PP) with respect to a fixed part (FP) are shown in an environment classically defined as a field environment. As shown the carrier signal of the fixed part (FP) 10 and the portable part (PP) 11 comprises k frames where the Kth frame of the PP has become out of synchronization with the FP. The two carrier signals 10 and 11 start out in sync 12 and after k frames are out of sync 13 caused by the relative drift of the clocks of the fixed and portable parts, or a change in the environment such as change in the temperature. When it has been determined that the PP clock is no longer within a predetermined range of approximately −15 to +8 timing bits with respect to the FP clock, the frequency of the PP clock is automatically calibrated by changing the frequency 14 of the PP clock until the timing of the two carrier signals are synchronized to within the predetermined range of timing bits.

At the beginning of calibration the clock of the PP is started at a frequency near but below the frequency of the FP, and the frequency of the clock of the PP is increased until the two clocks are synchronous resulting in a timing relationship between −15 and +8 timing bits. It should be noted that although the preferred method of synchronizing the two clocks starts with a low PP clock frequency and increases the frequency until the two clocks are synchronous, other approaches also fall within the scope of this disclosure where the frequency of the portable part is changed in some orderly way that allows convergence on synchronization of the two clocks, e.g. starting at a high frequency and lowering the frequency of the portable part until synchronization is accomplished. After calibration, the timing relationship between the two clocks is again checked after "Y" data frames to determine that the two clocks are still within the acceptable timing range before ending the calibration of the PP clock with respect to the FP clock. It should also be noted that even though calibration takes some number of data frames to verify, when the two clocks become out of synchronization (calibration) a calibration procedure is started immediately.

Figure 3:
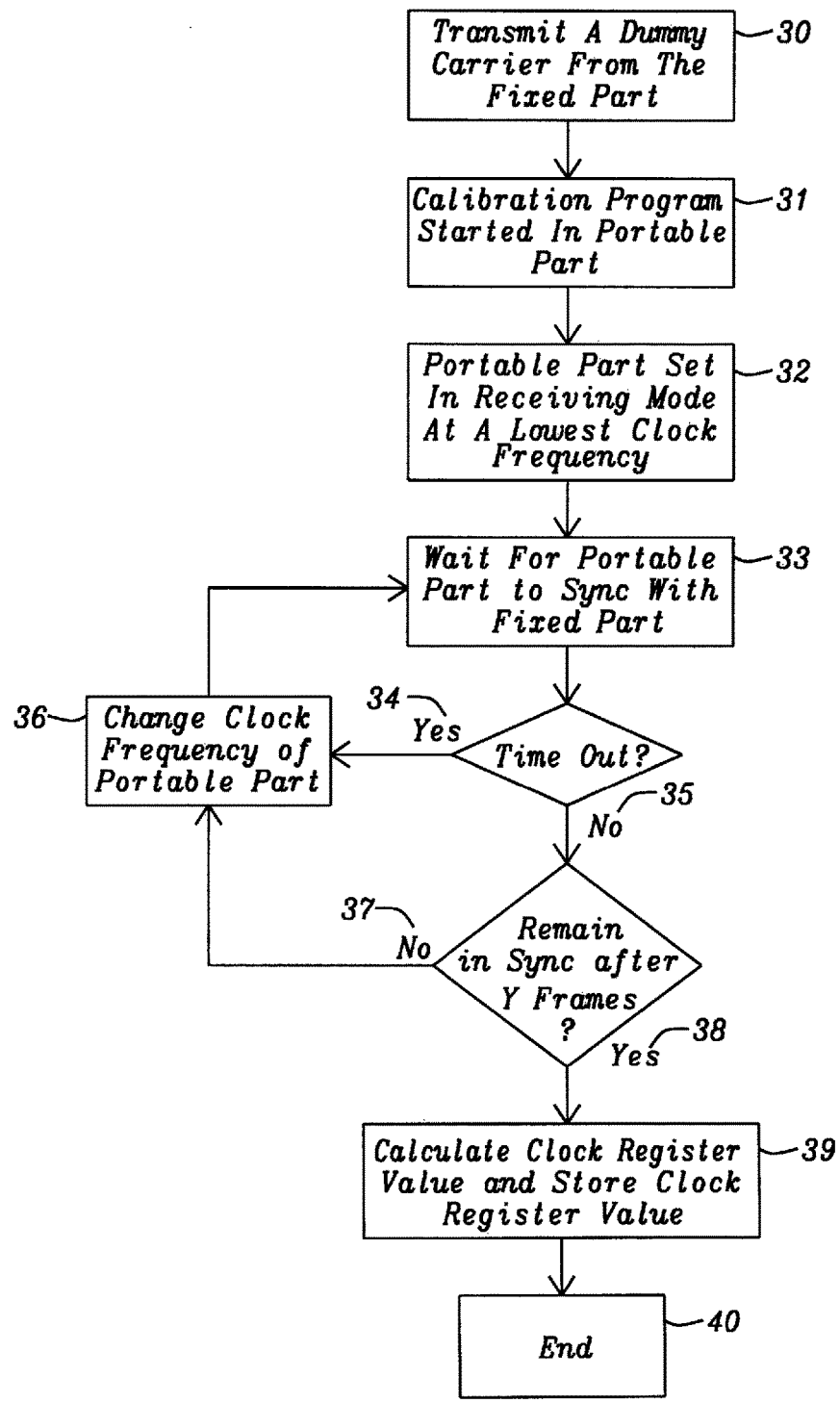
FIG. 3 is a flow diagram of the method to calibrate the clock of the portable part with the fixed part of the present disclosure.

In FIG. 2 the fixed part 20 and the portable part 21 are shown where data frames that are in synchronization for "Y" data frames. For each of the "m" to "Y" data frames, which are in synchronization, phase and TAP data are stored in buffers 22 in the portable part. "Phase" is the phase relationship between the FP and PP clocks in decimal units, wherein Phase=1 means that to PP clock has a phase relationship with respect to the FP clock where the PP clock is one bit late, and Phase=1 means that the PP clock is one bit early. TAP provides a greater resolution of the phase relationship between the FP and PP clocks, wherein the phase relationship is expressed in units of 1/9 of a phase unit, or digital bit. TAP is valuable for fine tuning, for example Phase=0 and TAP=8 is a phase relationship of 8/9 or almost a full bit. Increasing the phase relationship between the two clocks slightly by a TAP of one yields Phase=1 and Tap=0. When the number "Y" data frames is reached and the two clocks remain in synchronization, the phase and TAP data is used to determine the clock register value 23 and this register value is stored in non-volatile memory in the portable part. FIG. 3 shows the method of calibrating the portable part so the portable part and the fixed part are synchronous. When calibration is initiated, the fixed part transmits a series of dummy data frames 30, and the calibration program is started in the portable part 31. The portable part is set into receiving mode at the lowest possible clock frequency 32. Then there is a wait for synchronization with the clock of the fixed part 33. If the operation times out 34, the clock frequency of the portable part is changed (increased) 36 and the procedure returns to waiting for synchronization with the fixed part 33. If the operation does not time out 35 do the two clock signals remain in synchronization after "Y" data frames. If no 37, then change the frequency of the portable part 36 and return to waiting for synchronization 33. If the two clock signals remain in synchronization after "Y" data frames 38, then the portable clock register value is determined and the clock register value is stored 39 and the procedure ends 40.

Alternatively, the clock frequency is set at a frequency that is not low as stated in step 32, for instance the clock frequency is set high and when the procedure times out 34, the portable part clock frequency is changed (lowered) 36, which continues until the procedure does not time out 35. Other synchronous clock procedures may also be developed that are within the intent and scope of this patent disclosure.

Figure 4A:
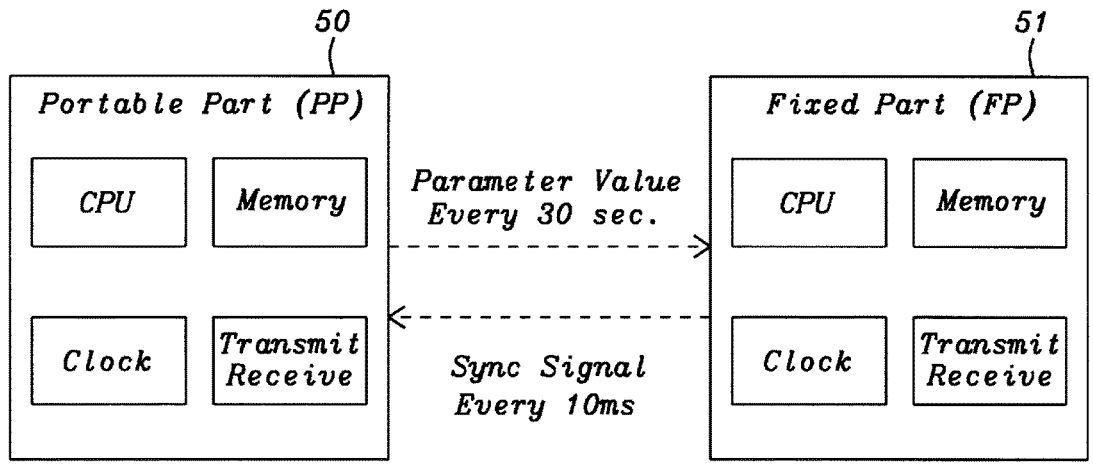
FIGS. 4A, 4B and 4C are diagrams that demonstrate an example of clock calibration and communication between the fixed and portable parts of the present disclosure.

It should be noted that the following is an example of the two part electronic device of the present disclosure and the calibration of the clocks between the two parts. Further it should be noted that this clock calibration is not during manufacturing and is performed for the first time after installation in a field environment. In FIG. 4A is shown a block diagram of a portable part (PP) 50 and a fixed part (FP) 51. The FP and the PP communicate wirelessly, wherein the FP provides a synchronization signal (synch signal) approximately every 10 ms looking for a response from the PP. The PP provides parameter data, e.g. humidity measurements, approximately every 30 sec.

Figure 4B:
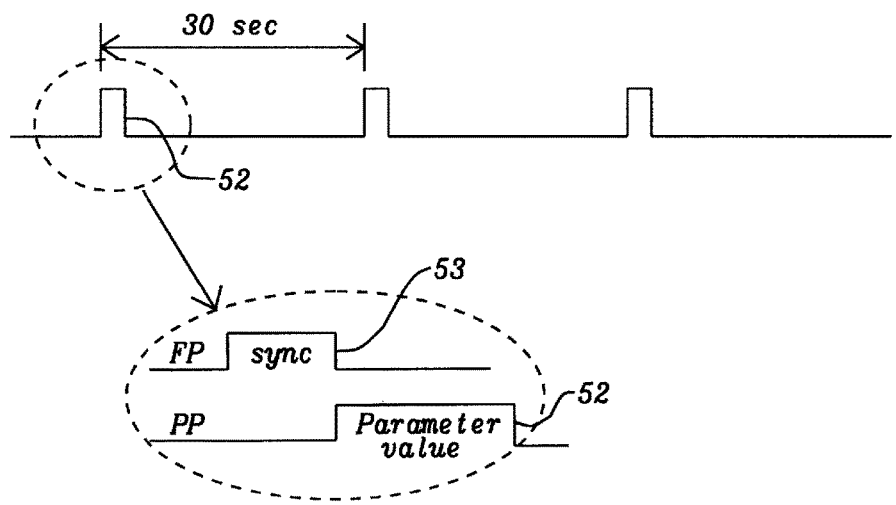

As shown in FIG. 4B, when the clocks of the FP and PP are in synchronization, an occurring data signal 52 is received by the FP 51 from the PP 50 upon the receipt of the sync signal 53 transmitted by the FP 51. The data signal in this example is humidity data, which is stored in the FP 51 and transferred to a system for analysis; however, the data signal could be any other parametric value that is being tracked by a PP 50.

Figure 4C:
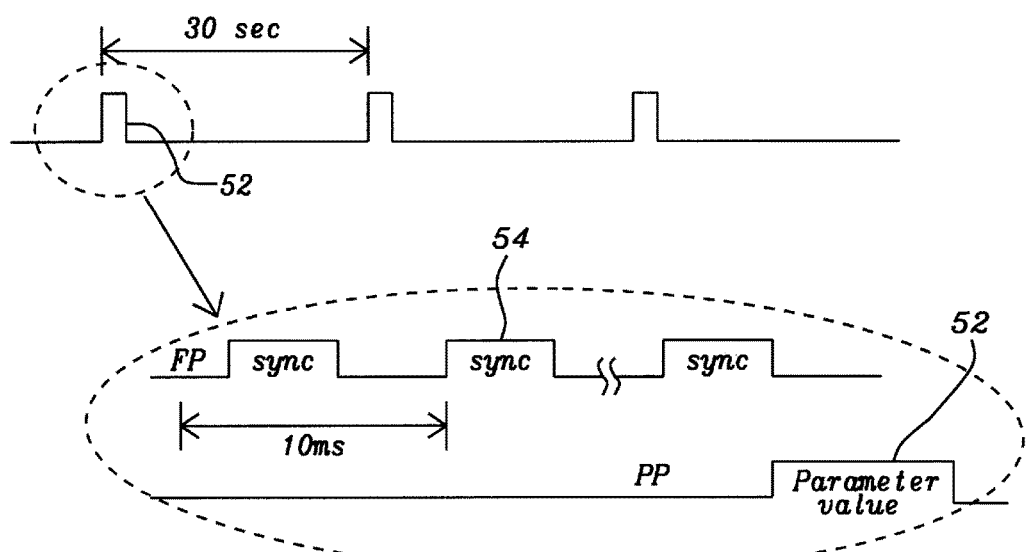

When the clocks of the PP 50 and the FP 51 are not in synchronization, as shown in FIG. 4C, several synchronization signals 54 are transmitted from the FP 51 approximately every 10 ms seeking the data signal, which is transmitted by the PP 50 approximately every 30 sec. The frequency of the data signal 54, comprising the parameter value (humidity in this example), is varied, as aforementioned, until the clock of the PP 50 is synchronized with the clock of the FP 51. The two clocks can drift out of synchronization by variations in environmental temperature of the PP 50 and perhaps the environmental temperature surrounding the FP 51, particularly if the parts and design that make up the oscillator of the FP are of a quality that allows a substantial drift in the FP clock frequency.

While the invention has been particularly shown and described with reference to preferred embodiments thereof, it will be understood by those skilled in the art that various changes in form and details may be made without departing from the spirit and scope of the invention.

What is claimed is:

1. A calibrated clock, comprising:
   a) a portable part coupled to a fixed part by wireless communications; and
   b) a first clock in said portable part automatically adjusted to be aligned with a second clock in the fixed part, wherein the frequency of the first clock varied until the first clock is synchronous with the second clock, and wherein a clock register value is stored in a non-volatile memory if after a predetermined number of data frames the first clock remains in synchronization with the second clock; wherein the fixed and the portable part periodically communicate wirelessly, wherein the fixed part provides periodically a synchronization signal looking for a response from the portable part and the portable part provides periodically to the fixed part parameter data, comprising environmental temperatures of the portable part and wherein for each of the predetermined number of data frames, which are in synchronization with the second clock, phase and Tap data is stored in buffers in the portable part, wherein phase is a phase relationship between fixed part and portable part clocks in decimal units and TAP provides a greater resolution of the phase relationship between the fixed part and portable part clocks.

2. The calibrated clock of claim 1, wherein said first clock is increased in frequency from a lowest frequency until the first clock is synchronized with the second clock.

3. The calibrated clock of claim 2, wherein said first clock is synchronized with the second clock to within a range of −15 to +8 timing bits.

4. The calibrated clock of claim 1, wherein said clock register value is stored in non-volatile memory along with a temperature of the environment surrounding the portable part.

5. The calibrated clock of claim 1, wherein said clock register value is calculated based on clock phase and TAP data stored after each data frame that the first clock remains in synchronization with the second clock.

6. The calibrated clock of claim 1, wherein said first clock is determined to be calibrated with the second clock after the first clock remains synchronous with the second clock after a predetermined number of data frames, whereas immediately upon detecting that the first and second clocks are no longer synchronous a new calibration procedure is started.

7. The calibrated clock of claim 1, wherein the periodically parameter data, provided to the fixed part, comprise humidity data of the portable part.

8. A method calibrating a clock of a wireless device, comprising:
   a) transmitting a reference carrier signal from a fixed part;
   b) starting a calibration program in a portable part;
   c) setting the portable part in a receiving mode at a frequency near a clock frequency of the fixed part;
   d) waiting for portable part to synchronize with the fixed part within a timing bit range;
   e) changing the frequency of the portable part if portable part fails to synchronize with the fixed part and return to step d); and
   f) calculating portable part clock register value and storing value if portable part remains synchronized with the fixed part for a predetermined number of data frames, otherwise change clock frequency and return to step d);
   wherein the fixed and the portable part periodically communicate wirelessly, wherein the fixed part provides periodically a synchronization signal looking for a response from the portable part and the portable part provides periodically to the fixed part parameter data, comprising environmental temperatures of the portable part and wherein for each of the predetermined number of data frames, which are in synchronization with the second clock, phase and Tap data is stored in buffers in the portable part, wherein phase is a phase relationship between fixed part and portable part clocks in decimal units and TAP provides a greater resolution of the phase relationship between the fixed part and portable part clocks.

9. The method of claim 8, wherein the frequency of the portable part is initially set near the clock frequency of the fixed part to initially set the portable part to the lowest possible frequency.

10. The method of claim 8, wherein changing the frequency of the portable part is performed by increasing the frequency of the portable part from the lowest possible frequency until synchronization is reached.

11. The method of claim 8, wherein said timing bit range is from −15 to +8 timing bits.

12. The method of claim 8, wherein calculating the portable part clock register value is derived from phase and TAP data stored after processing each data frame of the portable part.

13. The method of claim 8, wherein changing the frequency of the portable part is performed by lowering the frequency of the portable part from the highest possible frequency until synchronization is reached.

14. The method of claim 8, wherein the periodically parameter data, provided to the fixed part, comprise humidity data of the portable part.

* * * * *